United States Patent
Ware et al.

(10) Patent No.: US 9,842,630 B2
(45) Date of Patent: Dec. 12, 2017

(54) MEMORY COMPONENT WITH ADJUSTABLE CORE-TO-INTERFACE DATA RATE RATIO

(71) Applicant: RAMBUS INC., Sunnyvale, CA (US)

(72) Inventors: Frederick A. Ware, Los Altos Hills, CA (US); Ely K. Tsern, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 295 days.

(21) Appl. No.: 14/504,767

(22) Filed: Oct. 2, 2014

(65) Prior Publication Data

US 2015/0106561 A1    Apr. 16, 2015

Related U.S. Application Data

(60) Provisional application No. 61/891,715, filed on Oct. 16, 2013, provisional application No. 62/004,490, filed on May 29, 2014.

(51) Int. Cl.
*G06F 12/00* (2006.01)
*G11C 7/10* (2006.01)

(52) U.S. Cl.
CPC .............. *G11C 7/1066* (2013.01); *G11C 7/10* (2013.01); *G11C 7/1072* (2013.01)

(58) Field of Classification Search
CPC ........ G11C 7/1066; G11C 7/10; G11C 7/1072
See application file for complete search history.

(56) References Cited

U.S. PATENT DOCUMENTS

| | | | |
|---|---|---|---|
| 6,396,887 B1 | 5/2002 | Ware et al. | |
| 7,515,453 B2 | 4/2009 | Rajan | |
| 7,616,518 B2 | 11/2009 | Im et al. | |
| 7,684,279 B2 | 3/2010 | Seo | |
| 2006/0117155 A1* | 6/2006 | Ware .................... | G11C 7/1006 711/163 |
| 2012/0124251 A1 | 5/2012 | Hnatko et al. | |

OTHER PUBLICATIONS

Improving Power and Data Efficiency with Threaded Memory Modules Frederick A. Ware and Craig Hampel, Member, IEEE Rambus Inc. Los Altos CA, 94022, 2006 1-8 pgs.*

* cited by examiner

*Primary Examiner* — David X Yi
*Assistant Examiner* — Tahilba Puche
(74) *Attorney, Agent, or Firm* — Lowenstein Sandler LLP

(57) ABSTRACT

A memory component includes a memory bank comprising a plurality of storage cells and a data interface block configured to transfer data between the memory component and a component external to the memory component. The memory component further includes a plurality of column interface buses coupled between the memory bank and the data interface block, wherein a first column interface bus of the plurality of column interface buses is configured to transfer data between a first storage cell of the plurality of storage cells and the data interface block during a first access operation and wherein a second column interface bus of the plurality of column interface buses is configured to transfer the data between the first storage cell and the data interface block during a second access operation.

18 Claims, 12 Drawing Sheets

MEMORY COMPONENT WITH ADJUSTABLE CORE-TO-INTERFACE DATA RATE RATIO

RELATED APPLICATIONS

This application claims the benefit of U.S. Provisional Application No. 61/891,715 filed Oct. 16, 2013 and U.S. Provisional Application No. 62/004,490 filed May 29, 2014, the entire contents of each of which are hereby incorporated by reference herein.

BACKGROUND

Modern computer systems generally include a data storage device, such as a memory component. The memory component may be, for example a random access memory (RAM) or a dynamic random access memory (DRAM). The memory component includes memory banks made up of storage cells which are accessed by a memory controller or memory client through a command interface and a data interface within the memory component.

BRIEF DESCRIPTION OF THE DRAWINGS

The present disclosure is illustrated by way of example, and not by way of limitation, in the figures of the accompanying drawings.

DETAILED DESCRIPTION

Figure 1:
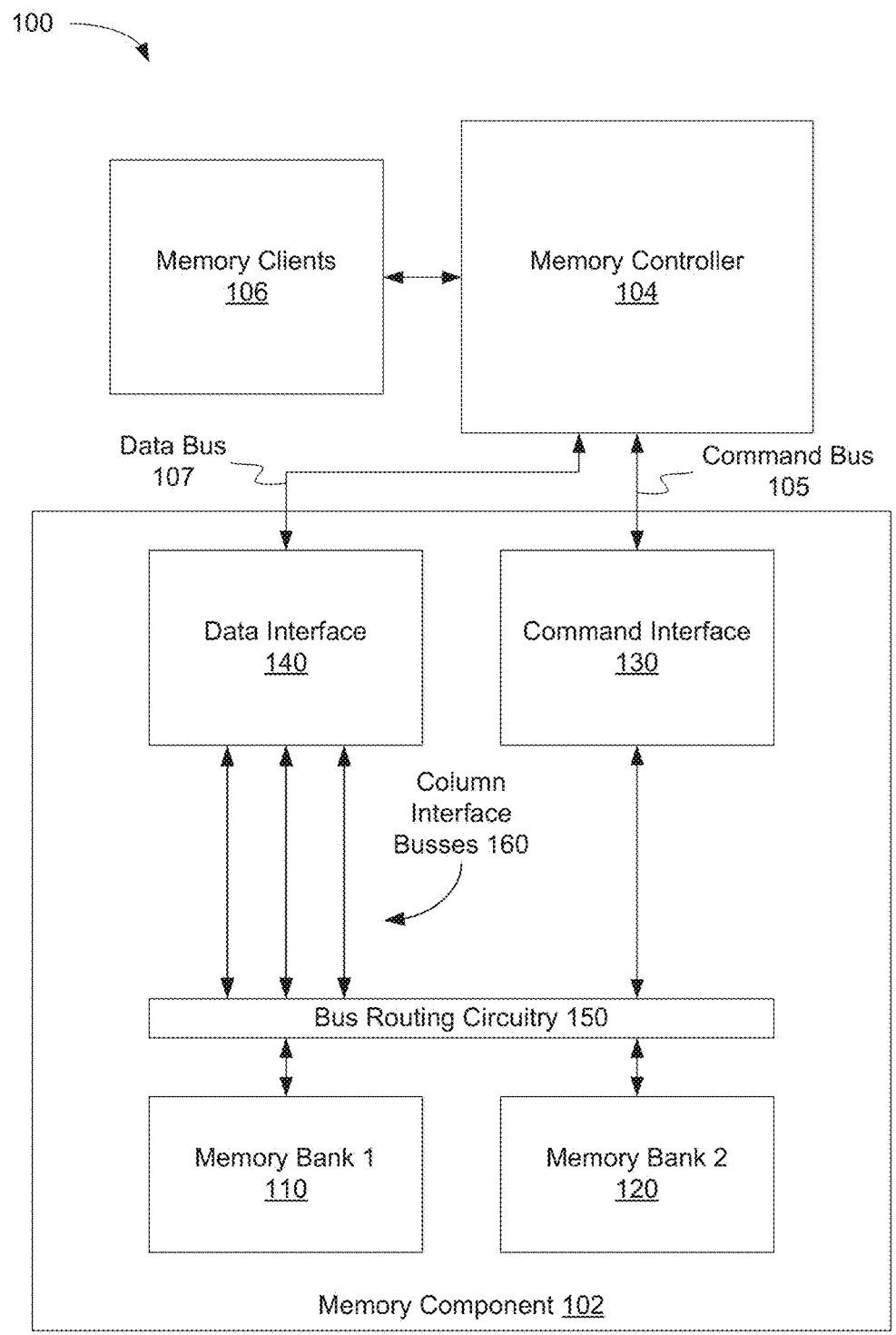
FIG. 1 is a block diagram illustrating a computing system including a memory component with an adjustable core-to-interface data rate ratio, according to an embodiment.

Embodiments are described for a memory component with an adjustable core-to-interface data rate ratio. In one embodiment, a memory component (e.g., a dynamic random access memory (DRAM)) includes one or more banks of memory cells. Each bank may include a number of memory cells where memory client data may be stored. Each cell in the memory banks may be identified by a memory address. A memory controller component external to the memory component may send commands to the memory component on behalf of the memory clients. These commands may include, for example, read, write, read-modify-write, or other commands. In one embodiment, a "component," as used herein, refers to a circuit or device embodied on a single chip or die. In other embodiments, individual components may be stacked or encapsulated with other die, however, each component is itself a single die.

In one embodiment, the memory component includes two or more bi-directional column interface buses. The column interface buses may be used to transfer data internal to the memory component, such as between a data interface and the one or more memory banks. A data bus (DQ) may be used to transmit data from the memory component, such as between the data interface of the memory component and the memory controller. In many memory systems, the speeds of the internal memory core and the external memory interface move in lockstep. Theoretically, as the speed of the memory core increases, the memory interface speed is also increased proportionally. In real-world implementations, however, there are practical limitations on the memory core speeds that can be achieved, due to cost, size or other factors. Thus, situations may arise where a faster memory interface is available, but the speed of the memory core is not sufficient to take advantage of the potential performance increase. Thus, in one embodiment, multiple column interface buses are used between the memory banks and the external data interface of a memory component. The use of multiple column interface buses allows for the transfer of data from a given storage cell of a plurality of storage cells in a memory bank on a first column interface bus during a first access operation associated with a data access command and for the transfer of data between the storage cell and the data interface block on a second column interface bus during a second access operation associated with the data access command. Data from the same memory location can be split into multiple portions and interleaved on multiple column interface buses. The access operations can be separated in time to avoid bus collisions. The data interface can begin outputting the requested data to the memory controller once the first portion of data is received over the column interface buses.

When a subsequent data access command is received, the memory component can transfer data associated with the second data access command between the data interface block in the memory component and the memory bank over the multiple column interface buses. A first portion of the data associated with the subsequent data access command is transferred on a third column interface bus and a second portion of the data associated with the subsequent data access command is transferred to the data interface block on the first column interface bus. The delay period between access operations ensures that the first bus is free in order to transfer the second portion of the data associated with the subsequent access command. Future data access commands can be serviced utilizing the multiple column interface buses in a similar revolving fashion. This approach allows for slower memory banks (e.g., 266 MHz) to be used with a faster data interface (e.g., 6400 Mb/s) with improved performance as compared to a device having a single column interface bus. For example, depending on the embodiment, the interface bandwidth may improve by approximately 150% without any change to the memory core speed. This represents a significant improvement in performance of the memory component with minimal increases in cost and size.

FIG. 1 is a block diagram illustrating a computing system 100 including a memory component 102 with an adjustable core-to-interface data rate ratio, according to an embodiment. Computing system 100 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single computing device is illustrated, the term "computing system" or "computing device" shall also be taken to include any collection of machines that individually or jointly execute a set (or multiple sets) of instructions to perform any one or more of the methodologies discussed herein. In one embodiment, computing system 100 includes memory component 102, memory controller 104, and one or more memory clients 106.

Memory controller 104 can manage the flow of data going to and from memory component 102. For example, memory controller 104 can receive and process memory access requests from the one or more memory clients 106 in computing device 100. In addition, memory controller 104 can retrieve requested data from memory component 102 and provide the data to a requesting memory client 106. In one embodiment, memory controller 104 may have an internal queue that accepts memory access requests from requestors, such as memory clients 106. The requests may include, for example, reads, writes, read-modify-writes or other memory operations. In one embodiment, memory operations are held in the internal queue until the number of operations in the internal queue reaches a certain size (e.g., a threshold), and the operations are issued to memory component 102 in a burst or in a particular order. In another embodiment, memory operations are passed through to memory component 102 upon receipt. In one embodiment, memory controller 104 may be part of another component, such as a processing device. In other embodiments, however, memory controller 104 can be a separate chip or integrated into a different chip within computing device 100. For example, in another embodiment, the CPU and GPU cores of a processing device can be connected to one other and to an internal processor cache and memory controller 104 may be connected externally to the processing device. In other embodiments, memory controller 104 and memory clients 106 can be connected in some other fashion. A System-on-Chip (SoC) containing the memory controller 104 will often be referred to as the "Controller Component," "DRAM Controller," or "memory controller."

Memory component 102 may include a memory array, such as flash memory, dynamic random access memory (DRAM) (e.g., synchronous DRAM (SDRAM) or Rambus DRAM (RDRAM), etc.), or a static memory, such as static random access memory (SRAM), etc. Memory banks 110 and 120 may each include a number of memory cells or locations where data values may be stored. Each cell or collection of cells in the memory banks 110 and 120 may be identified by a memory address. Thus, when a command address signal (e.g., received as part of a read-modify-write request) is received by memory component 102, a command interface 130 can identify the corresponding location or cell in the memory banks 110 and 120. In embodiments, command and address receivers may be separate buses or may be multiplexed together in a single request interface. In other embodiments, memory component 102 may include fewer or additional memory banks, such as for example, eight memory banks or some other number of memory banks.

In one embodiment, memory component 102 includes memory banks 110 and 120, command interface 130, data interface 140, and bus routing circuitry 150. Memory banks 110 and 120 may be connected to other blocks in memory component 102, such as command interface 130 and data interface 140 by one or more column interface buses 160. In one embodiment, each of column interface buses 160 may include multiple individual wires (e.g., 128 wires or a 128 bit wide bus), so that multiple bits may be transferred across each of column interface buses 160 during a given time period. In one embodiment, bus routing circuitry 150 drives the data being transferred between memory banks 110, 120 and data interface 140 using multiple column interface buses 160. For example, if a memory access request includes a read of 256 bits of data from a given address in memory bank 110, bus routing circuitry 150 can divide the data into multiple portions (e.g., two 128 bit portions). Depending on the embodiment, bus routing circuitry 150 can be part of memory banks 110, 120, part of data interface 140, or a separate circuit within memory component 102. Bus routing circuitry 150 transfers the first portion over a first column interface bus during a first time period and transfers the second portion over a second column interface bus during a second time period. In one embodiment, there is a delay period between the first time period and the second time period. Data interface 140 can begin outputting the requested data to memory controller 104 once the first portion of data is received over column interface buses 160. This approach allows for a slower memory bank 110 (e.g., 266 MHz) to be used with a faster data interface 140 (e.g., 6400 Mb/s) with improved performance as compared to a device having a single column interface bus.

Command interface 130 and data interface 140 in memory component 102 may be connected to memory controller 104 by command bus 105 and data bus 107, respectively. In one embodiment, memory controller 104 and memory component 102 communicate with each other across a high-speed Very Low Swing-Near Ground (VLS-NG) signaling interface. VLS-NG signaling operates in one design at speeds of up to 2 Gbps, using very low voltage swings in order to minimize power. A reference clock (CK) and command-address (CA) 105 and data (DQ) 107 lanes may all utilize the VLS-NG technology, while standard rail-to-rail CMOS signaling may be used for chip enable (EN) lanes.

In one embodiment, the CA lanes 105 are utilized to deliver commands and addresses from the memory controller 104 to the memory component 102, while the DQ lanes 107 carry read and write data between the two. The number of CA and DQ lanes used to communicate between the memory controller 104 and the memory component 102 are scalable parameters of the interface architecture. The number of CA and DQ lanes implemented may be dependent upon the quantity and width of the memory component 102 and the required CA and DQ bandwidth. In one embodiment, the memory controller 104 is sized to support the appropriate number of CA and DQ lanes for each system. In one embodiment, all CA and DQ data transfers may be synchronous, meaning that they are referenced to CK transitions.

Figure 2:
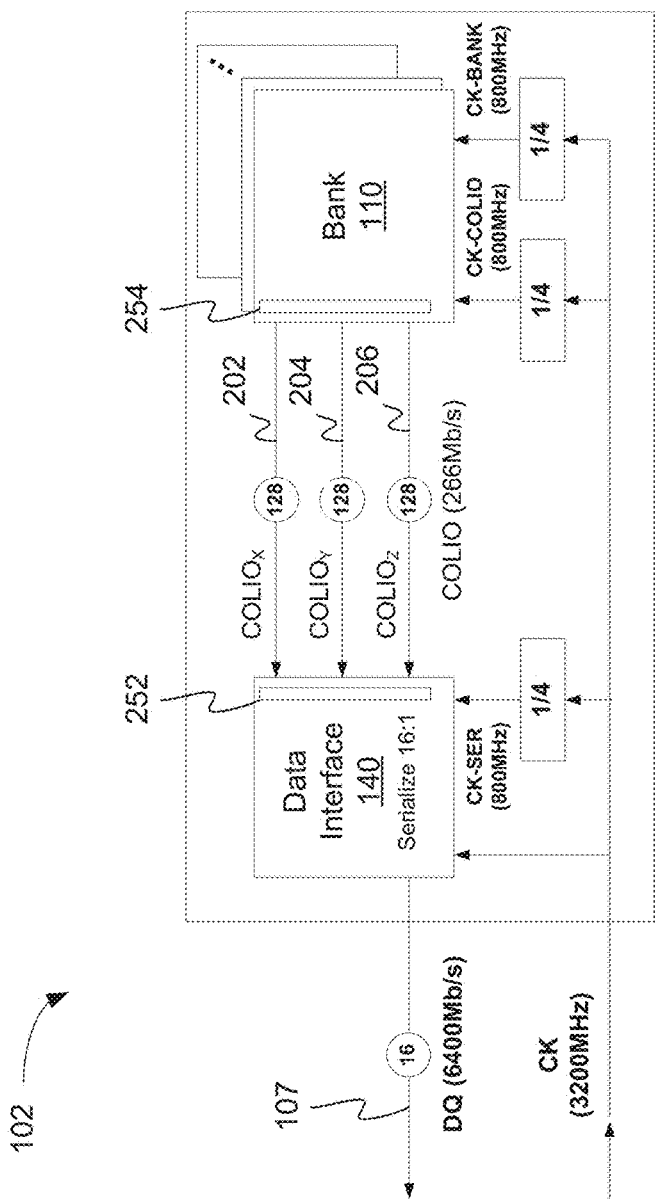
FIG. 2 is a block diagram illustrating a memory component with an adjustable core-to-interface data rate ratio, according to an embodiment.

FIG. 2 is a block diagram illustrating a memory component 102 with an adjustable core-to-interface data rate ratio, according to an embodiment. As described above, in one embodiment, memory component 102 includes a number of memory banks, including memory bank 110, data interface 140 and bus routing circuitry 252, 254. In one embodiment, rather than being a separate component, bus routing circuitry 252, 254 may be embedded within data interface 140 and memory bank 110. In this embodiment, the column interface buses have been shown as three separate 128 bit buses, including column interface bus 202, column interface bus 204 and column interface bus 206. In other embodiments, these column interface buses may be referred to as COLIOx 202, COLIOy 204 and COLIOz 206, respectively. Column interface buses 202, 204, 206 pass read and write data between data interface 140 and memory banks 110. In practice, the memory component 102 may include more or fewer column interface buses, depending on the embodiment. In one embodiment, each of column interface buses 202, 204, 206 includes 128 individual wires. In other embodiments, however, there may be some other number of buses and each bus may include some other number of wires. The illustrated embodiment shows three memory banks, including memory bank 110. In other embodiments, however, memory component 102 may include some other number of memory banks.

In one embodiment, a data access command is received at command interface 130 from memory controller 104 over command bus 105. The command may include, for example, a read or write command. For ease of discussion, the following description will be directed towards a read command, although one of skill in the art would understand that the described approach can be used similarly with a write command or other data access command. As is described in more detail below, bus routing circuitry 254 may split the requested data from bank 110 into multiple portions (e.g., two 128 bit portions). Bus routing circuitry 254 may route a first portion of the data on column interface bus 202 during a first access operation occurring at a first time. After a period of delay, bus routing circuitry 254 may route a second portion of the data on column interface bus 204 during a second access operation occurring at a second time. Bus routing circuitry 252 in data interface 140 may receive the first and second portions of the data over buses 202 and 204, respectively. Data interface 140 may serialize the data for output over a 16 bit high-speed (e.g., 6400 Mb/s) data bus DQ, such as data bus 107. Additional details of the operation of memory component 102 with an adjustable core-to-interface data rate ratio are provided below with respect to the timing diagram in FIG. 3 and the flow diagrams in FIGS. 9 and 10.

Figure 3:
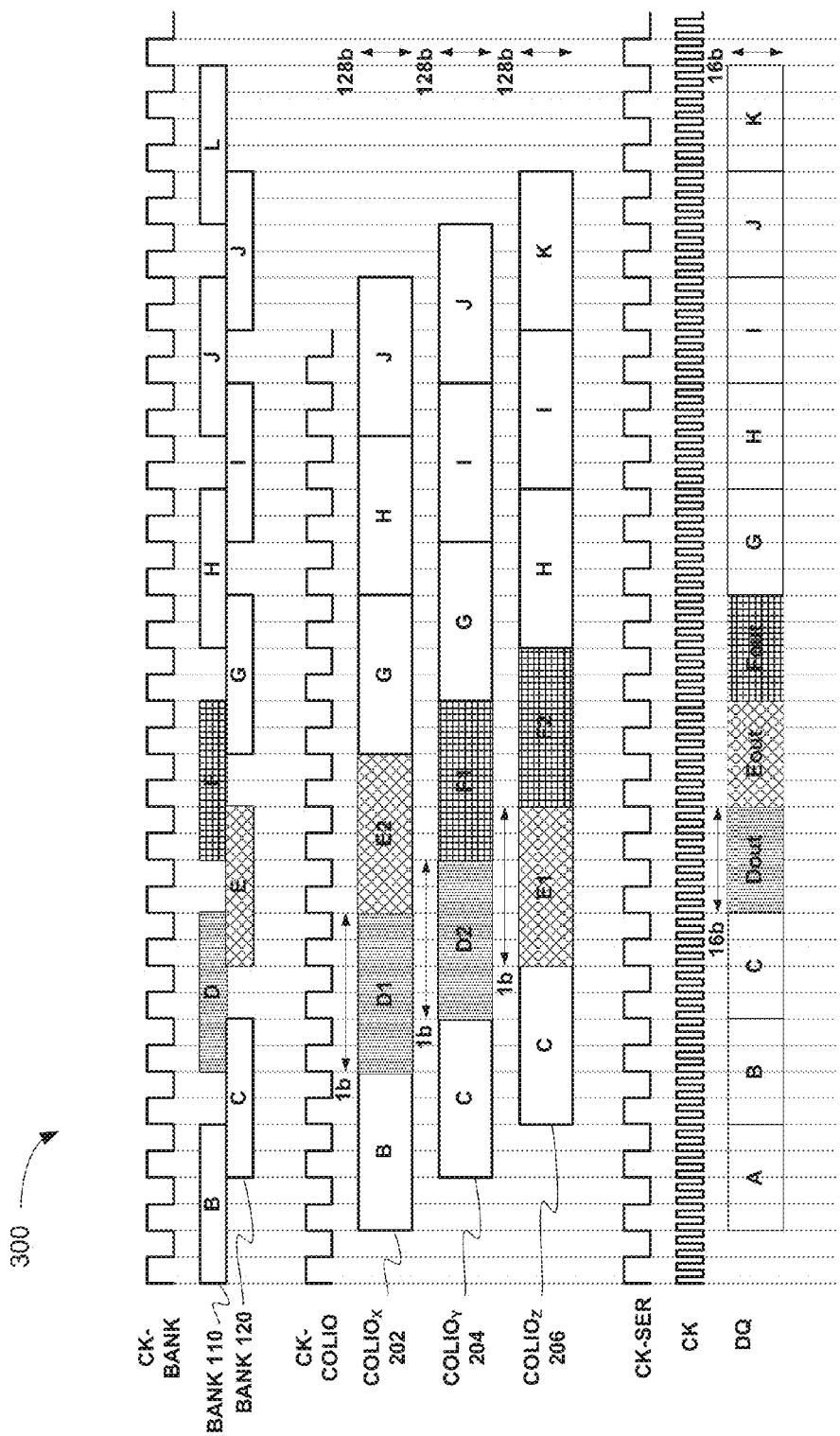
FIG. 3 is a timing diagram illustrating an adjustable core-to-interface data rate ratio in a memory component, according to an embodiment.

FIG. 3 is a timing diagram 300 illustrating an adjustable core-to-interface data rate ratio in a memory component, according to an embodiment. Timing diagram 300 illustrates a series of access operations D1, D2, E1, E2, F1, F2 associated with multiple data access commands D, E, F. These commands D, E, F may be received over the command bus 105, and may represent read requests, write requests, or other data access commands. Timing diagram 300 illustrates the column cycle intervals and column interface buses where the access operations D1, D2, E1, E2, F1, F2 corresponding to each of these memory operations D, E, F, occur relative to one another, according to one embodiment.

In one embodiment, memory controller 104 issues a series of data access commands, including commands D, E, F, spaced in time according to a clock signal CK-BANK. In one embodiment, the clock signal CK-BANK has a frequency of 800 MHz and the commands are spaced at even intervals of the clock signal. The data access commands may be issued by memory controller 104 in an order such that the memory banks to which the commands are directed alternate. For example, command D may be directed to memory bank 110, command E may be directed to memory bank 120, and command F may be directed to memory bank 110. In a memory component having additional memory banks, rather than alternating, the data access commands may be issued in such a way that no two successive commands are directed to the same memory bank.

In one embodiment, bus routing circuitry 254 accesses data from a location in memory bank 110 indicated by a data address associated with data access command D. Bus routing circuitry 254 may divide the data into multiple segments that can be transmitted from memory bank 110 to data interface 140 in a series of access operations D1, D2. In one embodiment, the first portion of the data is transmitted across column interface bus 202 during a first access operation D1. In one embodiment, during access operation D1, the first 128 bits of the requested data are driven across column interface bus 202 for a period of time corresponding to access operation D1 and measured using clock signal CK-COLIO. In one embodiment, the clock signal CK-COLIO has a frequency of 800 MHz and the access operation D1 lasts for a period of three clock cycles. After a delay period, bus routing circuitry 254 may transmit the second portion of the data across column interface bus 204 during a second access operation D2. In one embodiment, during access operation D2, the second 128 bits of the requested data are driven across column interface bus 204 for a period of time corresponding to access operation D2. In one embodiment, the delay period is equal to one clock cycle of clock signal CK-COLIO or one third of the length of an access operation. In other embodiments, however, the delay period may be some other length of time.

Once the first portion of the data from access operation D1 is received by bus routing circuitry 252, data interface 140 can serialize the data according to clock signal CK-SER. In one embodiment, the clock signal CK-SER also has a frequency of 800 MHz. During output operation Dout, data interface 140 can output the serialized data on data bus (DQ) 107 for transfer to memory controller 104 or memory clients 106. In one embodiment, data bus 107 operates according to clock signal CK, which may have a frequency of 3200 MHz. Accordingly, up to 16 bits can be transferred on each of the 16 wires in data bus 107 during the output operation Dout.

In one embodiment, bus routing circuitry 254 accesses data from a location in memory bank 120 indicated by a data address associated with data access command E. Bus routing circuitry 254 may divide the data into multiple segments that can be transmitted from memory bank 130 to data interface 140 in a series of access operations E1, E2. In one embodiment, the first portion of the data is transmitted across column interface bus 206 during a first access operation E1. In one embodiment, during access operation E1, the first 128 bits of the requested data are driven across column interface bus 206 for a period of time corresponding to access operation E1. After a delay period, bus routing circuitry 254 may transmit the second portion of the data across column interface bus 202 during a second access operation E2. In one embodiment, during access operation E2, the second 128 bits of the requested data are driven across column interface bus 202 for a period of time corresponding to access operation E2. In one embodiment, the delay period is such that the previous access operation D1 on column interface bus 202 is complete in time for the access operation E2 to begin. Once the first portion of the data from access operation E1 is received by bus routing circuitry 252, data interface 140 can serialize the data according to clock signal CK-SER. During output operation Eout, data interface 140 can output the serialized data on data bus (DQ) 107 for transfer to memory controller 104 or memory clients 106.

In one embodiment, bus routing circuitry 254 accesses data from a location in memory bank 110 indicated by a data address associated with data access command F. Bus routing circuitry 254 may divide the data into multiple segments that can be transmitted from memory bank 130 to data interface 140 in a series of access operations F1, F2. In one embodiment, the first portion of the data is transmitted across column interface bus 204 during a first access operation F1. In one embodiment, during access operation F1, the first 128 bits of the requested data are driven across column interface bus 204 for a period of time corresponding to access operation F1. After a delay period, bus routing circuitry 254 may transmit the second portion of the data across column interface bus 206 during a second access operation F2. In one embodiment, during access operation F2, the second 128 bits of the requested data are driven across column interface bus 206 for a period of time corresponding to access operation F2. Once the first portion of the data from access operation F1 is received by bus routing circuitry 252, data interface 140 can serialize the data according to clock signal CK-SER. During output operation Fout, data interface 140 can output the serialized data on data bus (DQ) 107 for transfer to memory controller 104 or memory clients 106.

Figure 4:
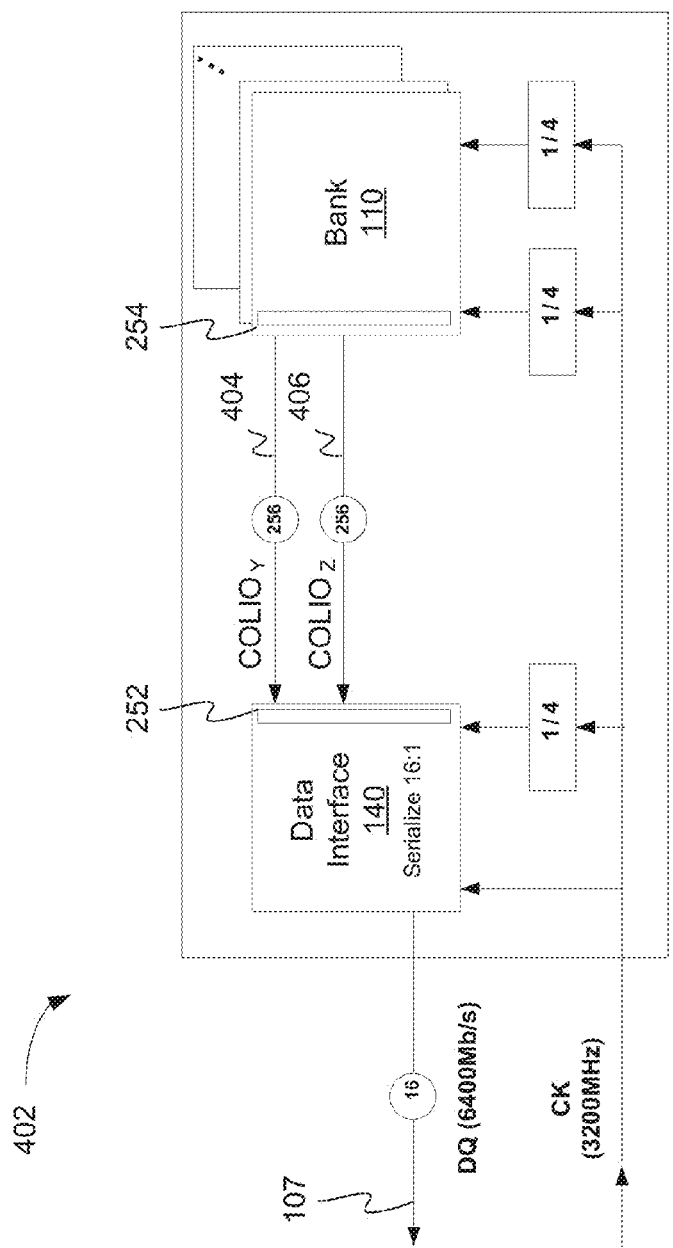
FIG. 4 is a block diagram illustrating a memory component with an adjustable core-to-interface data rate ratio, according to an alternative embodiment.

FIG. 4 is a block diagram illustrating a memory component 402 with an adjustable core-to-interface data rate ratio, according to an alternative embodiment. As described above, in one embodiment, memory component 402 includes a number of memory banks, including memory bank 110, data interface 140 and bus routing circuitry 252, 254. In one embodiment, rather than being a separate component, bus routing circuitry 252, 254 may be embedded within data interface 140 and memory bank 110. In this embodiment, column interface buses have been shown as two separate 256 bit buses, including column interface bus 404 and column interface bus 406. In other embodiments, these column interface buses may be referred to as COLIOy 404 and COLIOz 406, respectively. Column interface buses 404, 406 pass read and write data between data interface 140 and memory banks 110. In practice, the memory component 402 may include more or fewer column interface buses, depending on the embodiment. In one embodiment, each of column interface buses 404, 406 includes 256 individual wires. In other embodiments, however, there may be some other number of buses and each bus may include some other number of wires. The illustrated embodiment shows three memory banks, including memory bank 110. In other embodiments, however, memory component 402 may include some other number of memory banks.

In one embodiment, a data access command received is at command interface 130 from memory controller 104 over command bus 105. The command may include, for example, a read or write command. As is described in more detail below, bus routing circuitry 254 may route a segment of data on column interface bus 404 during a first access operation occurring at a first time. After a period of delay, bus routing circuitry 254 may route a second segment of data on column interface bus 406 during a second access operation occurring at a second time. Bus routing circuitry 252 in data interface 140 may receive the first and second segments of the data over buses 404 and 406, respectively. Data interface 140 may serialize the data for output over a 16 bit high-speed (e.g., 6400 Mb/s) data bus DQ, such as data bus 107. Additional details of the operation of memory component 402 with an adjustable core-to-interface data rate ratio are provided below with respect to the timing diagram in FIG. 5.

Figure 5:
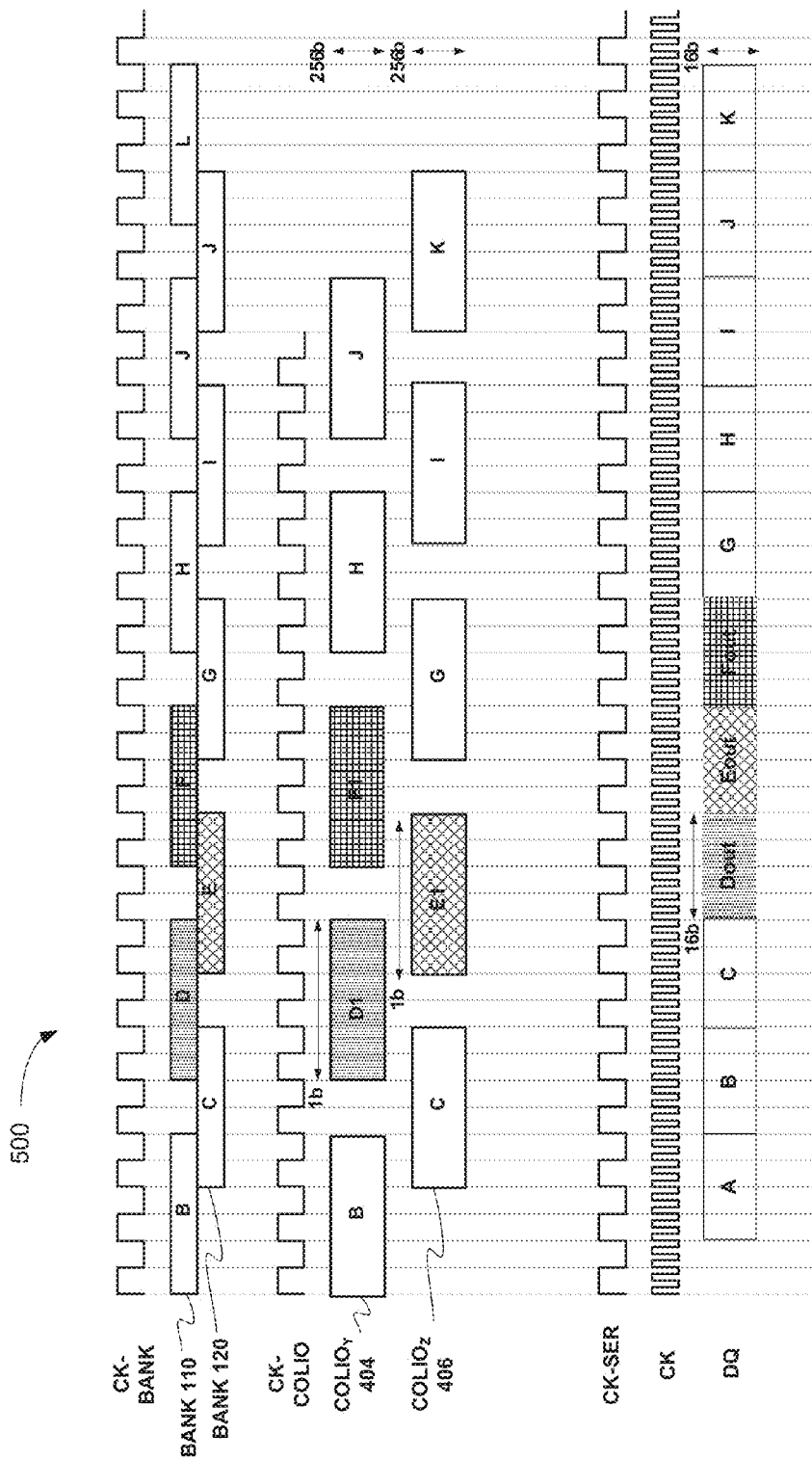
FIG. 5 is a timing diagram illustrating an adjustable core-to-interface data rate ratio in a memory component, according to an alternative embodiment.

FIG. 5 is a timing diagram illustrating an adjustable core-to-interface data rate ratio in a memory component, according to an alternative embodiment. Timing diagram 500 illustrates a series of access operations D1, E1, F1 associated with multiple data access commands D, E, F. These commands D, E, F may be received over the command bus 105. Timing diagram 500 illustrates the column cycle intervals and column interface buses where the access operations D1, E1, F1 corresponding each of these memory operations D, E, F, occur relative to one another, according to one embodiment.

In one embodiment, memory controller 104 issues a series of data access commands, including commands D, E, F, spaced in time according to a clock signal CK-BANK. In one embodiment, the clock signal CK-BANK has a frequency of 800 MHz and the commands are spaced at even intervals of the clock signal. The data access commands may be issued by memory controller 104 in an order such that the memory banks to which the commands are directed alternate. For example, command D may be directed to memory bank 110, command E may be directed to memory bank 120, and command F may be directed to memory bank 110. In a memory component having additional memory banks, rather than alternating, the data access commands may be issued in such a way that no two successive commands are directed to the same memory bank.

In one embodiment, bus routing circuitry 254 accesses data from a location in memory bank 110 indicated by a data address associated with data access command D. In one embodiment, the data associated with command D is transmitted across column interface bus 404 during a first access operation D1. In one embodiment, during access operation D1, the 256 bits of requested data are driven across column interface bus 404 for a period of time corresponding to access operation D1 and measured using clock signal CK-COLIO. In one embodiment, the clock signal CK-COLIO has a frequency of 800 MHz and the access operation D1 lasts for a period of three clock cycles.

Once the data from access operation D1 is received by bus routing circuitry 252, data interface 140 can serialize the data according to clock signal CK-SER. In one embodiment, the clock signal CK-SER also has a frequency of 800 MHz. During output operation Dout, data interface 140 can output the serialized data on data bus (DQ) 107 for transfer to memory controller 104 or memory clients 106. In one embodiment, data bus 107 operates according to clock signal CK, which may have a frequency of 3200 MHz. Accordingly, up to 16 bits can be transferred on each of the 16 wires in data bus 107 during the output operation Dout.

In one embodiment, after a delay period, bus routing circuitry 254 accesses data from a location in memory bank 120 indicated by a data address associated with data access command E. In one embodiment, the delay period is equal to two clock cycles of clock signal CK-COLIO or two-thirds of the length of an access operation. In other embodiments, however, the delay period may be some other length of time. In one embodiment, the data associated with data access command E is transmitted across column interface bus 406 during a first access operation E1. In one embodiment, during access operation E1, the 256 bits of requested data are driven across column interface bus 406 for a period of time corresponding to access operation E1. Once the data from access operation E1 received by bus routing circuitry 252, data interface 140 can serialize the data according to clock signal CK-SER. During output operation Eout, data interface 140 can output the serialized data on data bus (DQ) 107 for transfer to memory controller 104 or memory clients 106.

In one embodiment, bus routing circuitry 254 accesses data from a location in memory bank 110 indicated by a data address associated with data access command F. In one embodiment, the data associated with command F is transmitted across column interface bus 204 during a first access operation F1. In one embodiment, during access operation F1, the 256 bits of requested data are driven across column interface bus 404 for a period of time corresponding to access operation F1. Once the data from access operation F1 is received by bus routing circuitry 252, data interface 140 can serialize the data according to clock signal CK-SER. During output operation Fout, data interface 140 can output the serialized data on data bus (DQ) 107 for transfer to memory controller 104 or memory clients 106.

Figure 6:
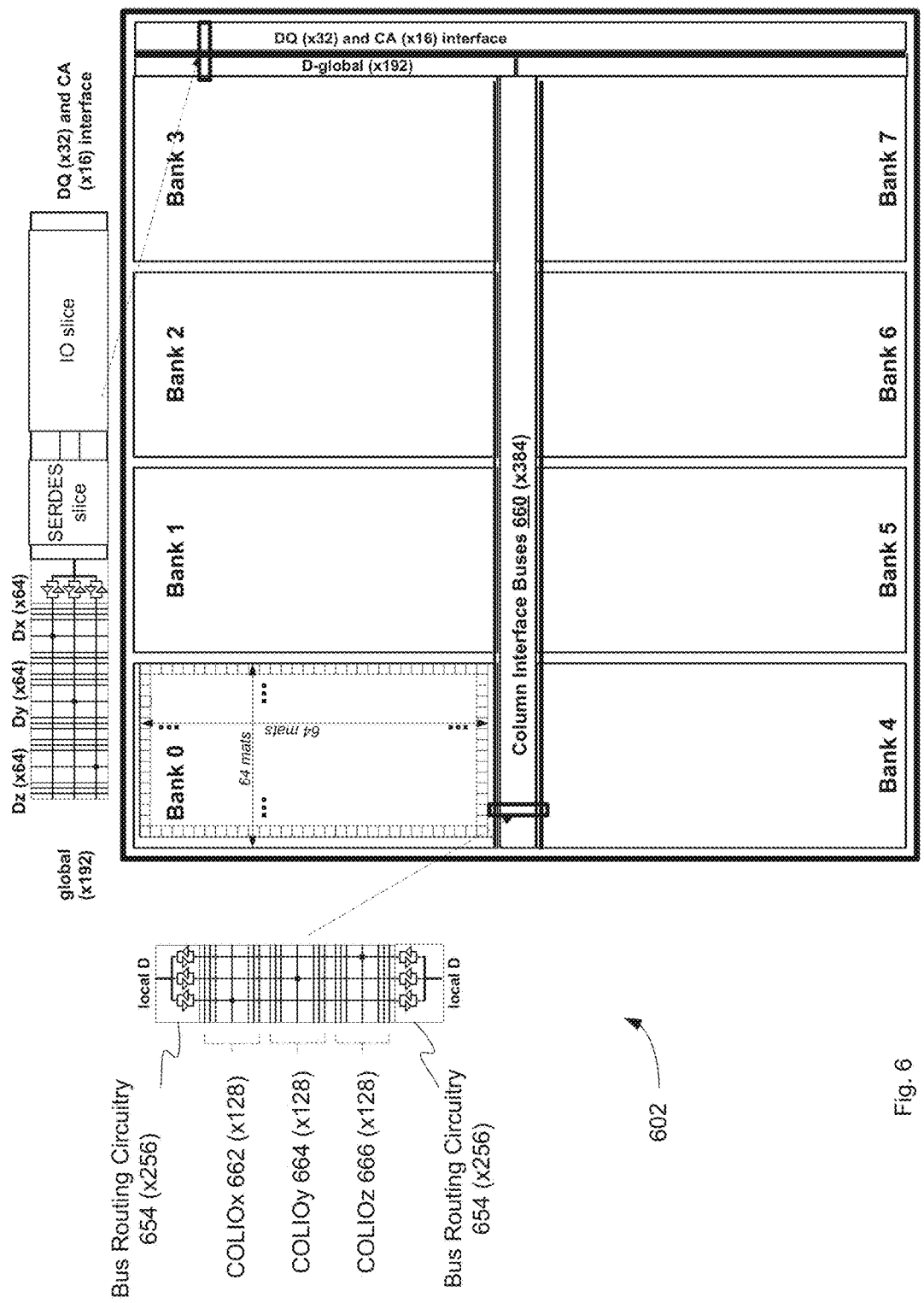
FIG. 6 is a block diagram illustrating a memory component with an adjustable core-to-interface data rate ratio, according to an embodiment.

FIG. 6 is a block diagram illustrating a memory component 602 with an adjustable core-to-interface data rate ratio, according to an embodiment. In one embodiment, memory component 602 may be similar to memory component 102, as discussed above with respect to FIGS. 1 and 2. In one embodiment, memory component 602 includes a number of memory banks, which may be similar to memory banks 110 and 120 discussed above. The memory banks in memory components may be arranged in pairs, where the memory banks in each pair are associated with one another. For example, the memory bank pairs may include Bank0 and Bank4, Bank1 and Bank5, Bank2 and Bank6, and Bank3 and Bank7. Each of the memory banks may be connected by column interface buses 660.

In one embodiment, each memory bank includes bus routing circuitry 654. In one embodiment, the bus routing circuitry may be located beneath or adjacent to the column interface buses 660. In one embodiment, column interface buses 660 may include multiple separate buses. For example, as shown in the expanded view, column interface buses 660 may include column interface bus 662, column interface bus 664 and column interface bus 666. The bus routing circuitry 654 in each memory bank may include a set of three drivers/receivers, where each driver/receiver is coupled to a different one of column interface buses 662, 664, 666. In this manner, each memory bank can be used to send or receive data over any of the column interface buses. Each of bus routing circuitries 654 may be similar to the bus routing circuitry 150 and 254 described above with respect to FIGS. 1 and 2, respectively.

In one embodiment, the bus routing circuitry 654 for each memory bank allows for adjustable core-to-interface data rate ratio including the overlapping of data segments being sent between a memory bank and data interface 140. In this manner, slower memory banks (e.g., 266 MHz) may be used with a faster data interface (e.g., 6400 Mb/s) with improved performance as compared to a device having a single column interface bus. The cost of this approach is that an additional column interface bus and bus routing circuitry is used. In one embodiment, however, the footprint can be reduced if the bus routing circuitry 654 is built under the three 128 bit column interface buses 662, 664, 668.

In one embodiment, memory controller 104 is aware of the ability of bus routing circuitry 256 to schedule data transfers on different column interface buses. With careful optimization and re-ordering of the data access commands and memory operations, the bandwidth for servicing these requests can improve by approximately 150% in a first mode of operation. In a second mode of operation, where memory controller 104 is not able to schedule data access commands to take advantage of bus routing circuitry 256, memory component 602 is still able to maintain at least the same bandwidth as previous single column interface components. In the second mode of operation, bus routing circuitry 256 may route data from a given memory bank on the same column interface bus during all access operations associated with the given data access command.

Figure 7A:
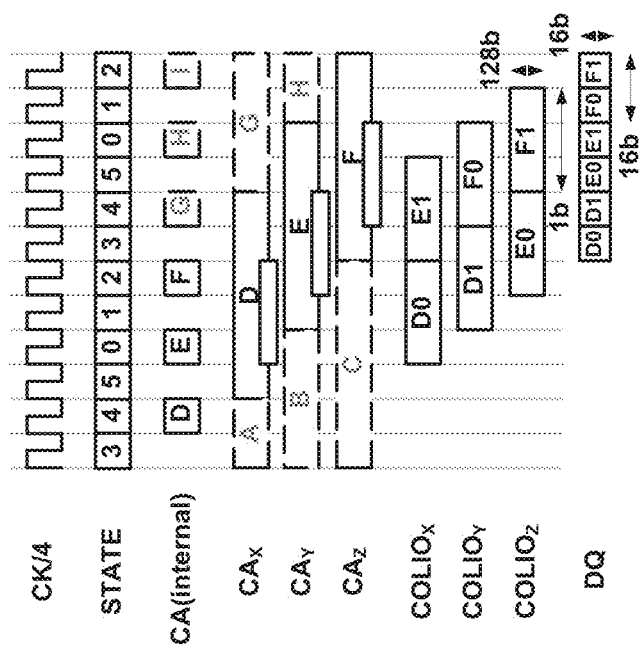
FIG. 7A is a timing diagram illustrating scheduling of memory read operations on a plurality of column interface buses in a memory component, according to an embodiment.

FIG. 7A is a timing diagram illustrating scheduling of memory read operations on a plurality of column interface buses in a memory component, according to an embodiment. In one embodiment, the access operations D0, D1, E0, E1, F0, F1 associated with memory operations D, E, F that occur on column interface buses COLIOx, COLIOy and COLIOz are processed according to the STATE waveform. The STATE waveform may be a decoded output of a three-bit state machine which continually counts through the states (0, 1, 2, 3, 4, 5). In one embodiment, the states (6, 7) are not used and are skipped. The STATE waveform allows the scheduling of access operations on the proper column interface bus. For example, in one embodiment, when a memory operation D is received during state 0, the first corresponding access operation D0 is scheduled on COLIOx and the second corresponding access operation D1 is schedule on COLIOy, after a delay period. When a memory operation E is received during state 2, the first corresponding access operation E0 is scheduled on COLIOz and the second corresponding access operation E1 is schedule on COLIOx, after a delay period. Similarly, when a memory operation F is received during state 4, the first corresponding access operation F0 is scheduled on COLIOy and the second corresponding access operation F1 is scheduled on COLIOz, after a delay period. The state machine (not shown) may be part of memory component 102 or may be located externally on some other chip in the system. When located on memory component 102, the three flip-flop bits and the associated decoding logic may be located near the command/address (CA) input interface. In one embodiment, the CA interface may be located on the edge of the chip 602, opposite the DQ interface. In other embodiments, the CA interface can be in other locations. Additionally, the state logic may be spread out across memory component 602, with parts located in several locations. The state machine may be powered-up to an arbitrary state and still function correctly, however, in one embodiment, the state machine may be forced to a specific state (e.g., state 0) at initialization time. In either case, once the STATE machine is running, it will not be disturbed.

Figure 7B:
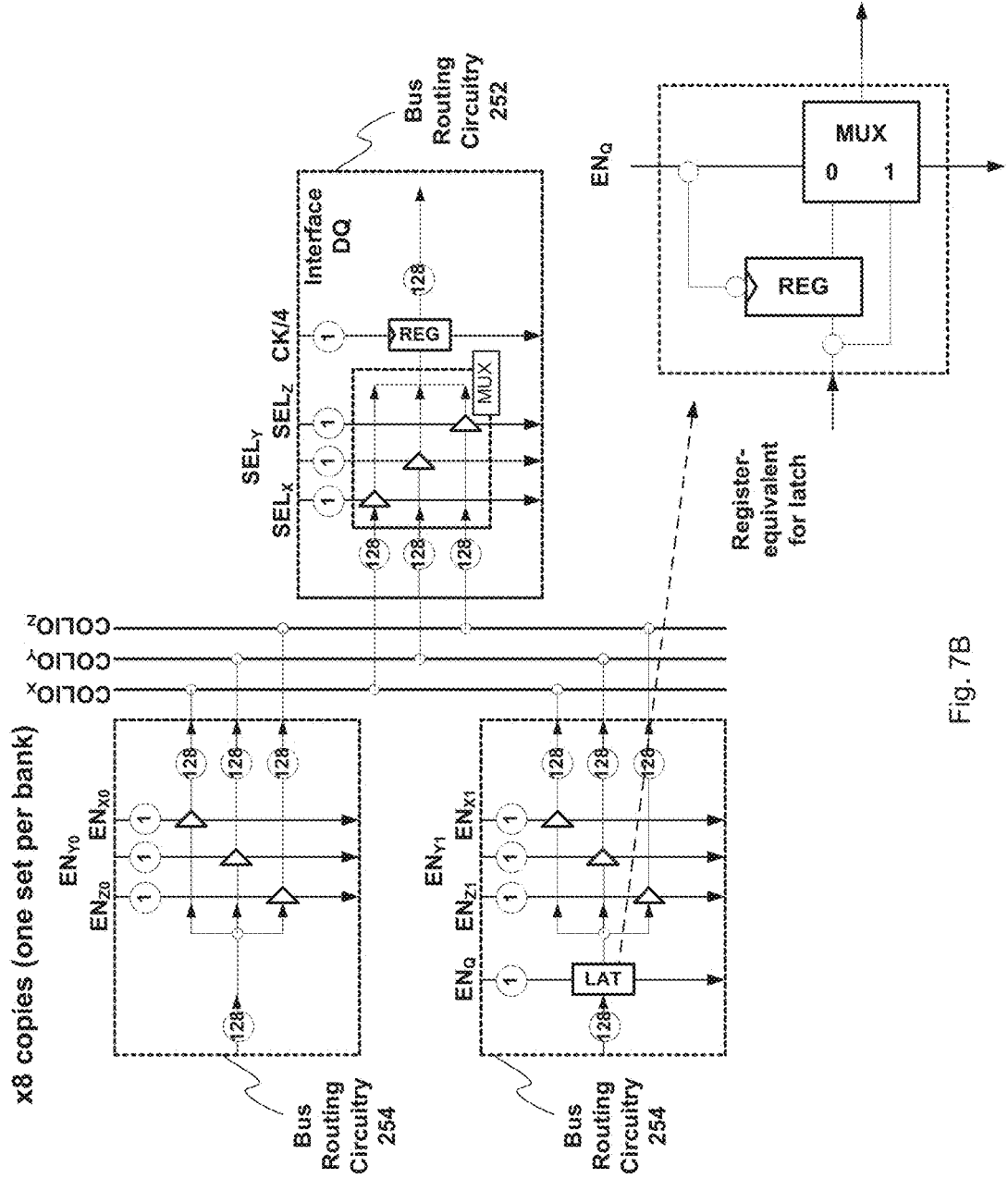
FIG. 7B is a block diagram illustrating bus routing circuitry for scheduling of memory read operations, according to an embodiment.

FIG. 7B is a block diagram illustrating bus routing circuitry for scheduling of memory read operations, according to an embodiment. In one embodiment, the bus routing circuitry 254 present in each memory bank of the memory component includes three drivers (i.e., one for each column interface bus COLIOx, COLIOy and COLIOz) that are each controlled by a respective enable signal EN. The decoded STATE values are used to create the various enable signals EN which signify which column interface bus is to be driven in each particular state. In one embodiment, at least one bus routing circuitry 254 includes a latch LAT. As shown in the expanded view that latch LAT may include at least one register and at least one multiplexer. The latch LAT passes the received data from memory bank 10 onto the appropriate column interface bus, as controlled by the enable signals EN. In one embodiment, bus routing circuitry 252 includes three receivers (i.e., one for each column interface bus). Each receiver may be controlled by a select signal SEL. The decoded STATE values are used to create the various select signals SEL which signifies which column interface bus is to be read in each particular state.

Figure 8A:
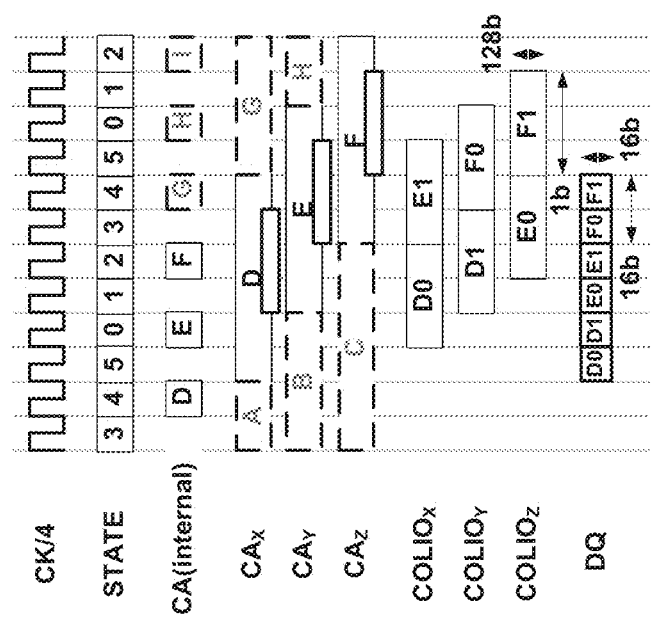
FIG. 8A is a timing diagram illustrating scheduling of memory write operations on a plurality of column interface buses in a memory component, according to an embodiment.

FIG. 8A is a timing diagram illustrating scheduling of memory write operations on a plurality of column interface buses in a memory component, according to an embodiment. Similar to the operation for read operations, as shown in FIG. 7A, the access operations D0, D1, E0, E1, F0, F1 associated with memory operations D, E, F that occur on column interface buses COLIOx, COLIOy and COLIOz are processed according to the STATE waveform. The STATE waveform allows the scheduling of access operations on the proper column interface bus.

Figure 8B:
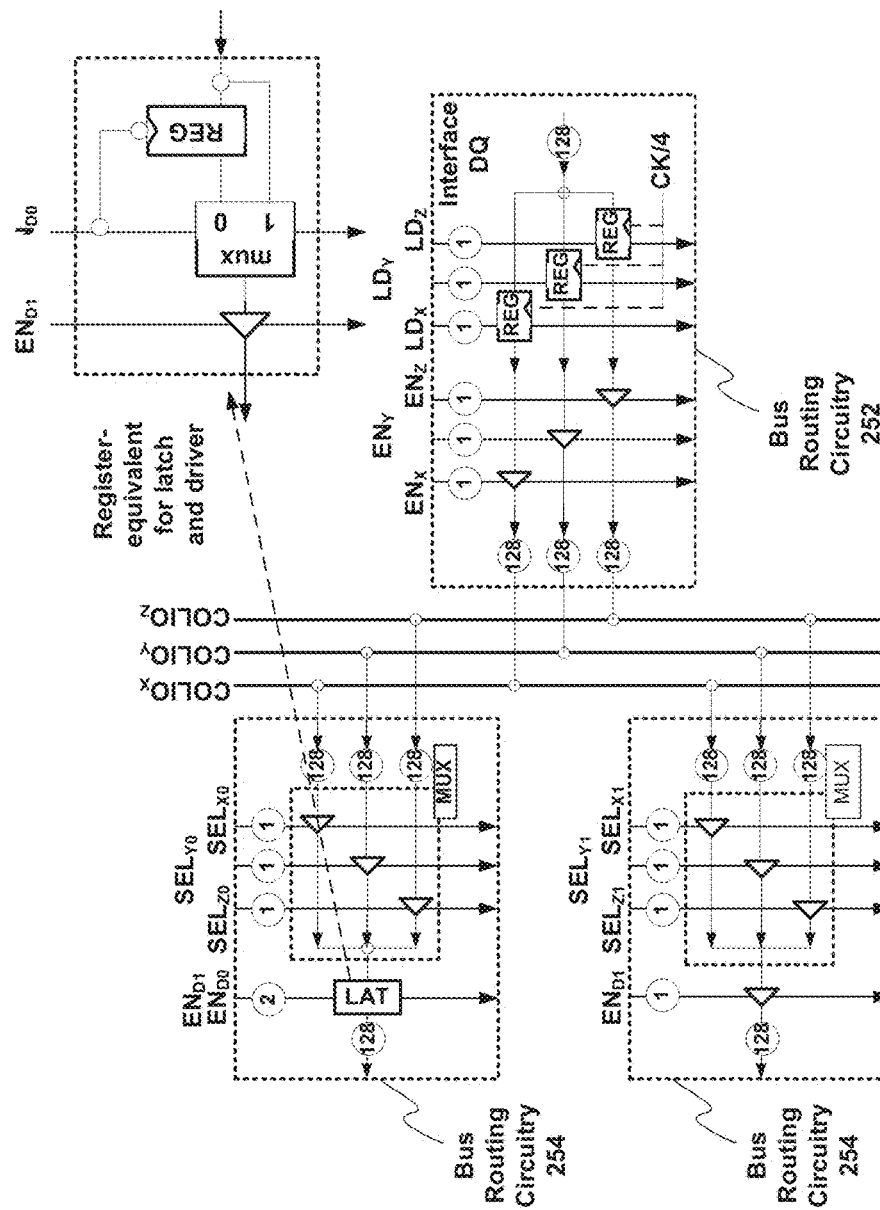
FIG. 8B is a block diagram illustrating bus routing circuitry for scheduling of memory write operations, according to an embodiment.

FIG. 8B is a block diagram illustrating bus routing circuitry for scheduling of memory write operations, according to an embodiment. In one embodiment, the bus routing circuitry 252 present in data interface 140 includes three drivers (i.e., one for each column interface bus COLIOx, COLIOy and COLIOz) that are each controlled by a respective enable signal EN, which signifies which column interface bus is to be driven in each particular state. In one embodiment, the bus routing circuitry 254 present in each memory bank of the memory component includes three receivers (i.e., one for each column interface bus). Each receiver may be controlled by a select signal SEL, which signifies which column interface bus is to be read in each particular state.

Figure 9:
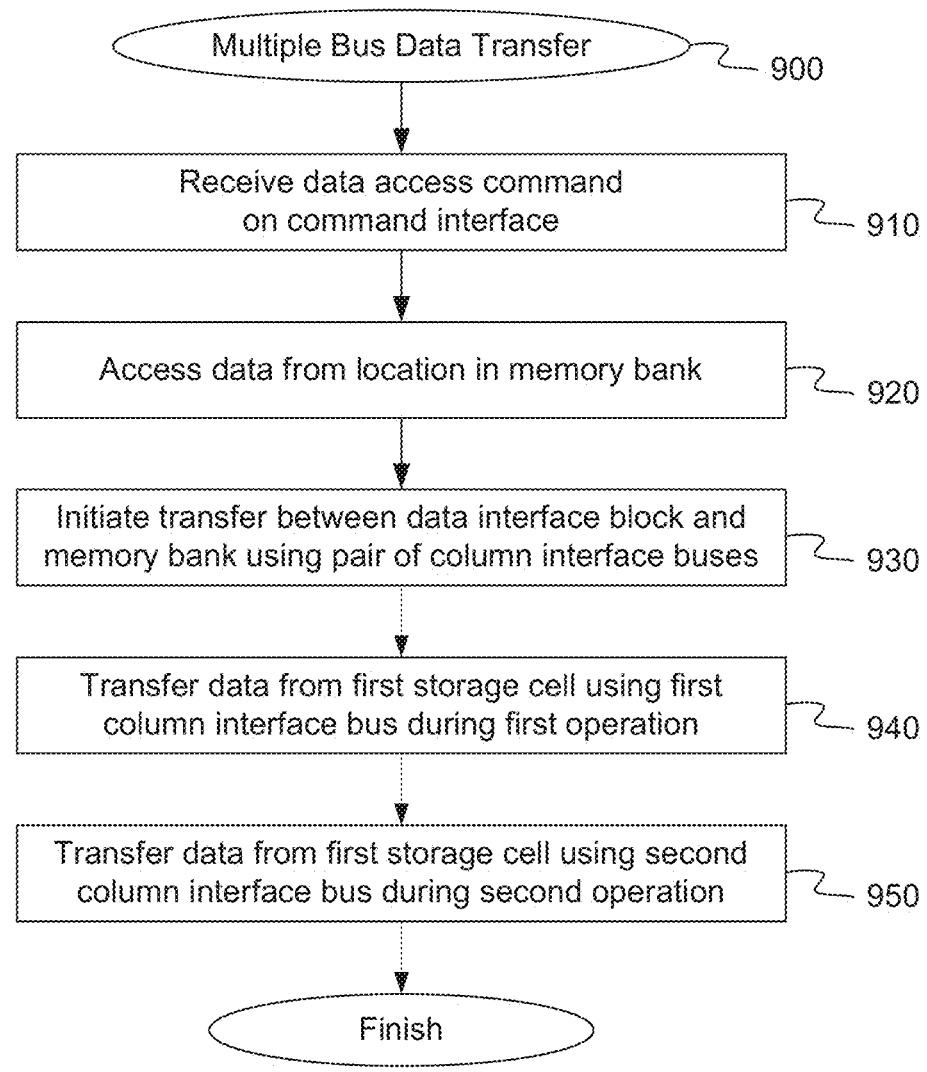
FIG. 9 is a flow diagram illustrating a multiple column interface bus data transfer method in a memory component, according to an embodiment.

FIG. 9 is a flow diagram illustrating multiple column interface bus data transfer method in a memory component, according to an embodiment. The method 900 may be performed by processing logic that comprises hardware (e.g., circuitry, dedicated logic, programmable logic, microcode, etc.), software (e.g., instructions run on a processing device to perform hardware simulation), or a combination thereof. The method 900 can interleave portions of data retrieved from a memory bank on multiple column interface buses for transfer to a data interface during multiple access operations. For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one embodiment, method 900 may be performed by memory component 102, as shown in FIGS. 1 and 2.

Referring to FIG. 9, at block 910, according to method 900, a data access command is received on a command interface 130. In one embodiment, memory controller 104 issues a series of data access commands, including commands D, E, F, spaced in time according to a clock signal CK-BANK. The data access commands may be issued by memory controller 104 in an order such that the memory banks to which the commands are directed alternate. For example, command D may be directed to memory bank 110, command E may be directed to memory bank 120, and command F may be directed to memory bank 110. In a memory component having additional memory banks, rather than alternating, the data access commands may be issued in such a way that no two successive commands are directed to the same memory bank. In one embodiment, the data access commands are received by command interface 130 and provided to memory banks 110, 120 over an internal command bus.

At block 920, method 900 includes accessing data from a location in a memory bank 110 indicated by a data address associated with the data access command. In one embodiment, bus routing circuitry 254 accesses the requested data from the location in memory bank 110. Bus routing circuitry 254 may divide the data into multiple segments that can be transmitted from memory bank 110 to data interface 140 in a series of access operations D1, D2.

At block 930, method 900 includes initiating a transfer of data between a data interface block 140 and the memory bank 110 using at least a pair of column interface buses 202, 204. Bus routing circuitry 254 may identify which column interface buses to use for data transfer during access operations D1, D2, based on which column interface buses were utilized for a previous data access command. In one embodiment, the buses in use rotate among available buses based on the output of a state machine in bus routing circuitry 254. For example, if there are three column interface buses 202, 204, 206, the state machine may rotate among three different output conditions, each indicating a different one of the available column interface buses.

At block 940, method 900 includes transferring data from a first storage cell in memory bank 110 using column interface bus 202 during a first access operation D1 associated with the received data access command. In one embodiment, the first portion of the data is transmitted across column interface bus 202 during a first access operation D1. In one embodiment, during access operation D1, the first 128 bits of the requested data are driven across column interface bus 202 for a period of time corresponding to access operation D1 and measured using clock signal CK-COLIO.

At block 950, method 900 includes transferring data from the first storage cell in memory bank 110 using column interface bus 204 during a second access operation D2 associated with the same data access command. After a delay period, bus routing circuitry 254 may transmit the second portion of the data across column interface bus 204 during a second access operation D2. In one embodiment, during access operation D2, the second 128 bits of the requested data are driven across column interface bus 204 for a period of time corresponding to access operation D2. In one embodiment, the delay period is equal to one clock cycle of clock signal CK-COLIO or one third of the length of an access operation. In other embodiments, however, the delay period may be some other length of time.

Figure 10:
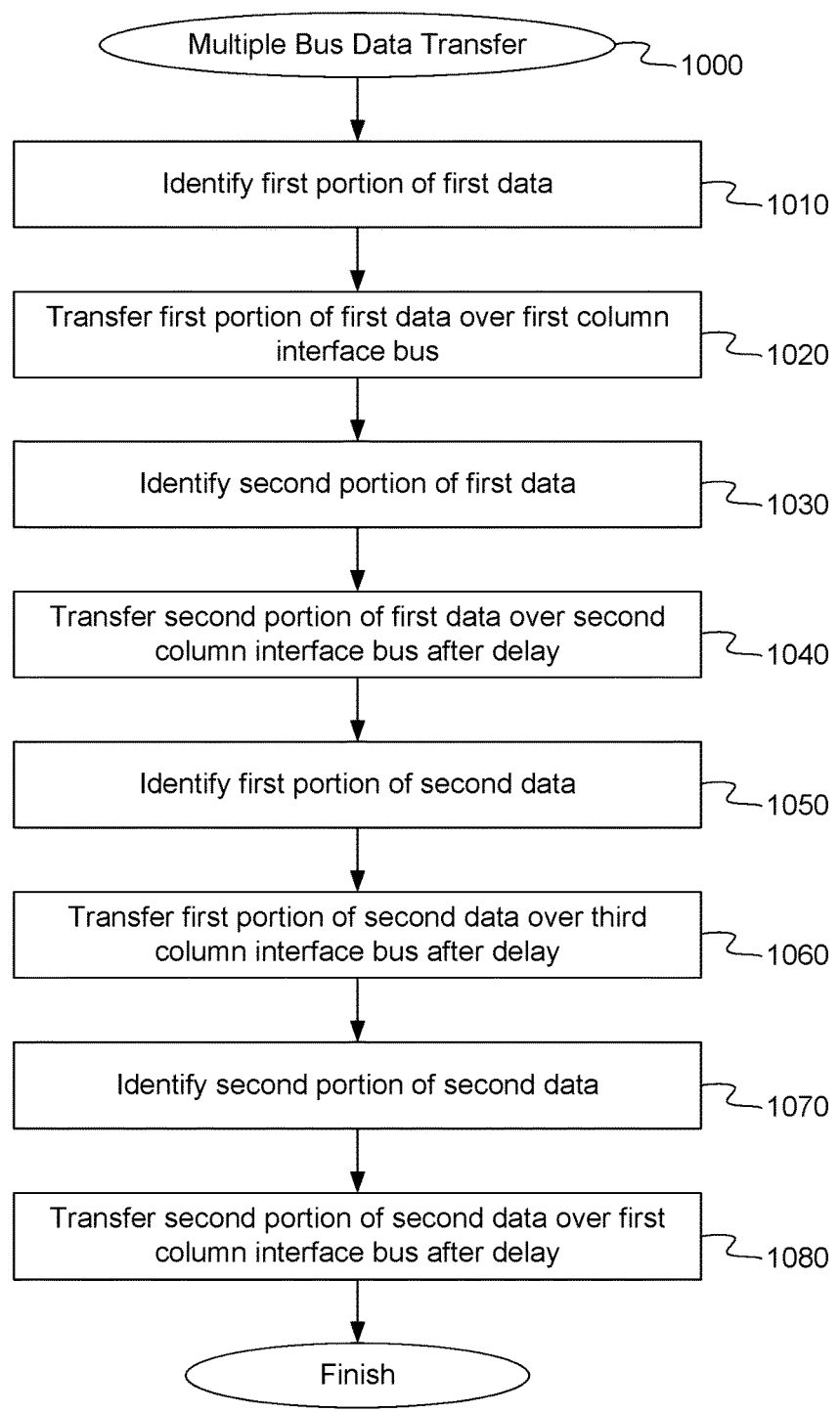
FIG. 10 is a flow diagram illustrating a multiple column interface bus data transfer method in a memory component, according to an embodiment.

FIG. 10 is a flow diagram illustrating multiple column interface bus data transfer method in a memory component, according to an embodiment. The method 1000 may be performed by processing logic that comprises hardware (e.g., circuitry, dedicated logic, programmable logic, microcode, etc.), software (e.g., instructions run on a processing device to perform hardware simulation), or a combination thereof. The method 1000 can interleave portions of data retrieved from a memory bank on multiple column interface buses for transfer to a data interface during multiple access operations. In one embodiment, method 1000 may be performed by memory component 102, as shown in FIGS. 1 and 2.

Referring to FIG. 10, at block 1010, according to method 1000 a first portion of a first data at a location in a memory bank 110 identified by a data address associated with a data access command is identified. In one embodiment, bus routing circuitry 254 divides the requested data into multiple portions. For example, if the requested data comprises a 256 bit data block, bus routing circuitry 254 may divide the data into two 128 bit portions. In one embodiment, the first portion may include the first 128 bits of the requested data block.

At block 1020, method 1000 includes transferring the first portion of the first data from the memory bank 110 to a data interface 140 over a first column interface bus 202. In one embodiment, the first portion of the data is transmitted across column interface bus 202 during a first access operation D1.

At block 1030, method 1000 includes identifying a second portion of the first data. In one embodiment, the second portion includes the remaining portion of the requested data block (e.g., the remaining 128 bits).

At block 1040, method 1000 includes transferring the second portion of the first data from the memory bank 110 to the data interface 140 over a second column interface bus 204 after a delay period. In one embodiment, the second portion of the data is transmitted across column interface bus 204 during a second access operation D2. In one embodiment, the delay period is equal to one clock cycle of clock signal CK-COLIO or one third of the length of an access operation. In other embodiments, however, the delay period may be some other length of time.

At block 1050, method 1000 includes identifying a first portion of a second data at a location in a memory bank 120 identified by a data address associated with a second data access command. In one embodiment, bus routing circuitry 254 divides the requested data into multiple portions. In one embodiment, the first portion may include the first 128 bits of the requested data block.

At block 1060, method 1000 includes transferring the first portion of the second data from the memory bank 110 to a data interface 140 over a third column interface bus 206 after a delay period. In one embodiment, the first portion of the data is transmitted across column interface bus 206 during a first access operation E1.

At block 1070, method 1000 includes identifying a second portion of the second data. In one embodiment, the second portion includes the remaining portion of the requested data block (e.g., the remaining 128 bits).

At block 1080, method 1000 includes transferring the second portion of the second data from the memory bank 110 to a data interface 140 over the first column interface bus 202 after a delay period. In one embodiment, the second portion of the data is transmitted across column interface bus 202 during a second access operation E2.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

Reference throughout this specification to "one embodiment" or "an embodiment" means that a particular feature, structure, or characteristic described in connection with the embodiments included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method of operation in a memory component, the method comprising:
   receiving, from a memory controller, a first data access command on a command interface, the first data access command comprising a data address indicating a location in a memory bank of the memory component;
   accessing data from the location in the memory bank indicated by the data address; and
   transferring the data between a data interface block in the memory component and the memory bank over a plurality of column interface buses, wherein transferring the data in a first mode of operation comprises transferring a first portion of the data between the data interface block and a first storage cell of a plurality of storage cells in the memory bank on a first column interface bus of the plurality of column interface buses during a first access operation associated with the first data access command and transferring a second portion of the data between the data interface block and the first storage cell on a second column interface bus of the plurality of column interface buses during a second access operation associated with the first data access command, wherein the first column interface bus is separate from the second column interface bus.

2. The method of claim 1, wherein the first access operation and the second access operation comprise read operations.

3. The method of claim 1, wherein the first access operation and the second access operation comprise write operations.

4. The method of claim 1, wherein a first delay period separates the transfer of the first portion of the data on the first column interface bus and the transfer of the second portion of the data on the second column interface bus.

5. The method of claim 4, further comprising:
   receiving a second data access command; and
   transferring data associated with the second data access command between the data interface block in the memory component and the memory bank over the plurality of column interface buses wherein a first portion of the data associated with the second data access command is transferred on a third column interface bus of the plurality of column interface buses and wherein a second portion of the data associated with the second data access command is transferred to the data interface block on the first column interface bus.

6. The method of claim 5, wherein a second delay period separates the transfer of the first portion of the data associated with the second data access command on the third column interface bus and the transfer of the second portion of the data associated with the second data access command on the first column interface bus.

7. The method of claim 1, wherein transferring the data in a second mode of operation comprises transferring the data between the data interface block and the plurality of storage cells in the memory bank on a same column interface bus of the plurality of column interface buses during all access operations associated with the first data access command.

8. A memory component comprising:
a memory bank comprising a plurality of storage cells;
a data interface block configured to transfer data between the memory component and a component external to the memory component; and
a plurality of column interface buses coupled between the memory bank and the data interface block, wherein a first column interface bus of the plurality of column interface buses is configured to transfer a first portion of the data between a first storage cell of the plurality of storage cells and the data interface block during a first access operation and wherein a second column interface bus of the plurality of column interface buses is configured to transfer a second portion of the data between the first storage cell and the data interface block during a second access operation, wherein the first column interface bus is separate from the second column interface bus.

9. The memory component of claim 8, wherein a first delay period separates the transfer of the first portion of the data from the first storage cell on the first column interface bus and the transfer of the second portion of the data from the first storage cell on the second column interface bus.

10. The memory component of claim 9, wherein a third column interface bus of the plurality of column interface buses is configured to transfer a first portion of a data from a second storage cell of the plurality of storage cells to the data interface block and wherein the first column interface bus is configured to transfer a second portion of the data from the second storage cell the data interface block.

11. The memory component of claim 10, wherein a second delay period separates the transfer of the first portion of the data from the second storage cell on the third column interface bus and the transfer of the second portion of the data from the second storage cell on the first column interface bus.

12. The memory component of claim 8, further comprising:
a state machine coupled to the memory bank and configured to provide an output value that rotates among a plurality of states; and
a bus routing circuitry coupled to the memory bank and configured to direct the data from the plurality of memory cells onto a pair of column interface buses of the plurality of column interface buses based on the output value of the state machine.

13. The memory component of claim 8, wherein the data interface block comprises a data serialization unit configured to serialize data received from the plurality of memory cells over the plurality of column interface buses before transferring the data to the external component.

14. The memory component of claim 8, further comprising:
a command interface coupled to the memory bank, the command interface to receive, from a memory controller, a first data access command, the first data access command comprising a data address indicating a location in the memory bank of the memory component, wherein the first and second access operations are associated with the first data access command.

15. A system comprising a memory component, the memory component comprising:
a plurality of memory banks, wherein each of the plurality of memory banks comprises a plurality of storage cells;
a data interface block to transfer data between the memory component and an external component in the system, wherein the data interface block to serialize data received in parallel from the plurality of memory banks into a single output stream on an output data connection; and
a plurality of column interface buses coupled between each memory bank of the plurality of memory banks and the data interface block, wherein a ratio of the plurality of column interface buses and the output data connection is greater than a power of two, wherein a first portion of the data is transferred on a first column interface bus of the plurality of column interface buses and a second portion of the data is transferred on a second column interface bus of the plurality of column interface buses after a delay period, and wherein the first column interface bus is separate from the second column interface bus.

16. The system of claim 15, wherein the data interface block to begin serialization upon receipt of the first portion of the data at the data interface block.

17. The system of claim 15, wherein the transfer of the first portion of the data from the plurality of memory banks on the first column interface bus is complete in time for the transfer of a data associated with a subsequent access to begin.

18. The method of claim 1, wherein a size of the first storage cell is greater than or equal to a bandwidth of at least one of the first column interface bus or the second column interface bus.

* * * * *